(12) United States Patent
Guo et al.

(10) Patent No.: US 7,733,143 B2
(45) Date of Patent: Jun. 8, 2010

(54) DUTY CYCLE CORRECTION CIRCUIT FOR HIGH-SPEED CLOCK SIGNALS

(75) Inventors: Chunbing Guo, Parsippany, NJ (US); Fuji Yang, Holmdel, NJ (US)

(73) Assignee: Agere Systems Inc., Allentown, PA (US)

( * ) Notice: Subject to any disclaimer, the term of this patent is extended or adjusted under 35 U.S.C. 154(b) by 5 days.

(21) Appl. No.: 11/962,886

(22) Filed: Dec. 21, 2007

(65) Prior Publication Data
US 2009/0160516 A1 Jun. 25, 2009

(51) Int. Cl.
*H03K 3/017* (2006.01)
(52) U.S. Cl. .................. 327/175; 327/172; 327/173
(58) Field of Classification Search .......... 327/172–176
See application file for complete search history.

(56) References Cited

U.S. PATENT DOCUMENTS 6,320,437 B1 * 11/2001 Ma ............................ 327/175
6,411,145 B1 * 6/2002 Kueng et al. ................. 327/175
6,844,766 B2 * 1/2005 Sun ............................ 327/284
7,282,977 B2 * 10/2007 Lee ............................ 327/175
7,496,155 B1 * 2/2009 Lu et al. ..................... 375/326
2008/0024182 A1 * 1/2008 Choi et al. .................. 327/175

* cited by examiner

*Primary Examiner*—Lincoln Donovan
*Assistant Examiner*—Shikha Goyal

(57) ABSTRACT

The present invention implements an apparatus for correcting duty cycle distortion in high speed clock signals. The apparatus includes delay cells that delay each of first and second differential initial clock signals. The apparatus further includes a latch that generates an output clock signal based on the delayed first and second differential initial clock signals. The apparatus further includes a differential feedback buffer that converts the output clock signal into first and second differential feedback signals. The apparatus further includes a feedback circuit that adjusts the delay cells based on the first and second differential feedback signals.

19 Claims, 8 Drawing Sheets

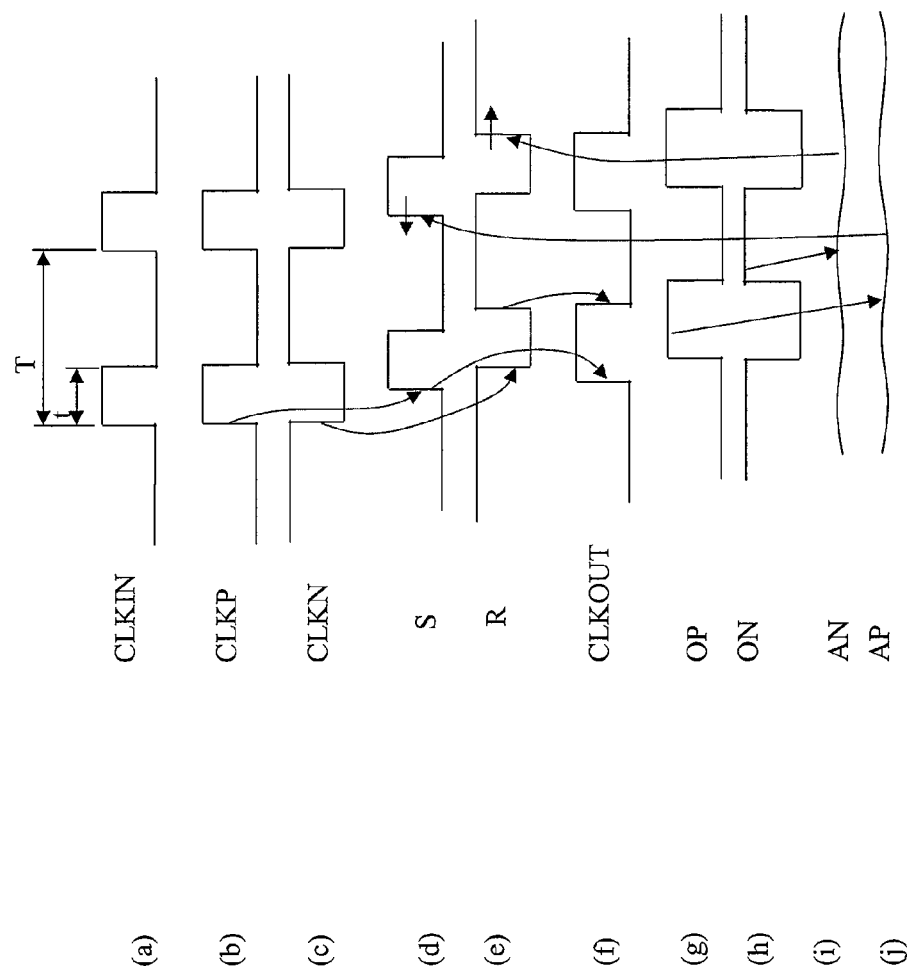

DUTY CYCLE CORRECTION CIRCUIT FOR HIGH-SPEED CLOCK SIGNALS

FIELD OF THE INVENTION

The invention pertains to electronic circuits that use a high speed clock signal. More particularly, the invention pertains to a method and apparatus for correcting duty cycle distortion in a high speed clock signal in an electronic circuit.

BACKGROUND OF THE INVENTION

In electronic devices, a clock signal that oscillates from a high state to a low state is used to coordinate the timing of two or more electronic circuits. Several electronic circuits can be coordinated together by feeding a common clock signal to each of the several circuits, synchronizing the rising and falling edges of the clock signal at each circuit, and then coordinating the circuits' timing based on the rising and/or falling edges of the common clock signal. The relative timing of the rising and falling edges of a clock signal is referred to as a "duty cycle". Typically, the rising edge and falling edge of a clock signal are separated by equal periods of time, resulting in a duty cycle of 50%.

As electronic devices are designed to run at faster speeds, the clock signals on the devices must oscillate at higher frequencies, where small amounts of signal distortion can significantly affect the duty cycle of the clock signal. As a result, electronic circuits in high speed devices often incorporate circuitry that corrects the distortion in a received clock signal in order to ensure accurate synchronization.

FIG. 1 shows a conventional Single-Ended Duty Cycle Correction (SEDCC) circuit 100 that is used to compensate for duty cycle distortion in a clock signal. The SEDCC circuit 100 includes a delay cell 102 that receives an input clock signal 104 through a buffer 108. The delay cell 102 introduces a delay to one of the two edges of the input clock signal 104 (i.e. rising edge or falling edge) based upon a DC error feedback signal 120. The delay cell 102 outputs an output clock signal 106 through two additional buffers 110 and 112. Since delay of only one edge of the input signal 104 is adjusted and that of the other edge is fixed, the time from a rising edge to the next falling edge will be adjusted. Thus, the delay introduced by the delay cell 102 causes the output clock signal 106 to have a different duty cycle than the input clock signal 104.

The SEDCC circuit 100 further includes a feedback loop that includes a feedback buffer 114, an RC filter 116 and an amplifier 118. The output clock signal 106 is received by the RC filter 116, through the feedback buffer 114. The RC filter 110 converts the output clock signal 106 to a DC averaged clock signal 122, which is input to an amplifier 118. The amplifier 118 compares the DC averaged clock signal 122 to a reference DC voltage of ½ Vdd and generates a DC error feedback signal 120 based on the voltage offset between the DC averaged clock signal 122 and ½ Vdd. The DC error feedback signal 120 is, therefore, based on the difference between the duty cycle of the output clock signal 106 and 50%. The delay cell 102 adjusts the duty cycle of output clock signal 106 based on the DC error feedback signal 120 in order to reduce the DC error feedback signal 120 to zero and achieve a 50% duty cycle in the adjusted clock signal 106.

FIG. 2 shows a circuit level diagram of the feedback buffer 114 and the RC filter 116 of FIG. 1. The feedback buffer 114 includes a PMOS device 150 and an NMOS device 152. The feedback buffer 114 receives the output clock signal 106 as input and transmits a buffered output clock signal 154 as output. When the output clock signal 106 is at a logic high level, the PMOS device 150 turns off and the NMOS device 152 turns on, pulling the buffered output clock signal 154 down to ground and giving the PMOS device 150 an effective resistance of Rp. When the adjusted clock signal 106 is at a logical low level, the NMOS device 152 turns off an the PMOS device 150 turns on, pulling the buffered output clock signal 154 up to Vdd and giving the NMOS device 152 an effective resistance of Rn. The RC filter 116 converts the buffered output clock signal 154 to the DC averaged clock signal 122.

A drawback of the SEDCC circuit 100 is that, in practice, a mismatch in the effective resistances of the NMOS device 152 and the PMOS device 150 of the buffer 114 may cause a variation in the DC averaged clock signal 122. As a result, when the duty cycle of the output clock signal 106 reaches 50%, the DC averaged clock signal 122 is offset higher or lower than ½ Vdd. The offset causes the DC error feedback signal 120 to have a non-zero value in response to a perfect clock signal, in response to which the delay cell 102 adjusts the duty cycle of output clock signal 106 away from the desired 50%.

SUMMARY OF THE INVENTION

The present invention implements an apparatus for correcting duty cycle distortion in high speed clock signals. The apparatus includes delay cells that delay each of first and second differential initial clock signals. The apparatus further includes a latch that generates an output clock signal based on the delayed first and second differential initial clock signals. The apparatus further includes a differential feedback buffer that converts the output clock signal into first and second differential feedback signals. The apparatus further includes a feedback circuit that adjusts the delay cells based on the first and second differential feedback signals.

BRIEF DESCRIPTION OF THE DRAWINGS

FIG. 4 shows waveforms that illustrate the functionality of the DDCC circuit according to one preferred embodiment of the present invention.

DETAILED DESCRIPTION OF THE INVENTION

Figure 1:
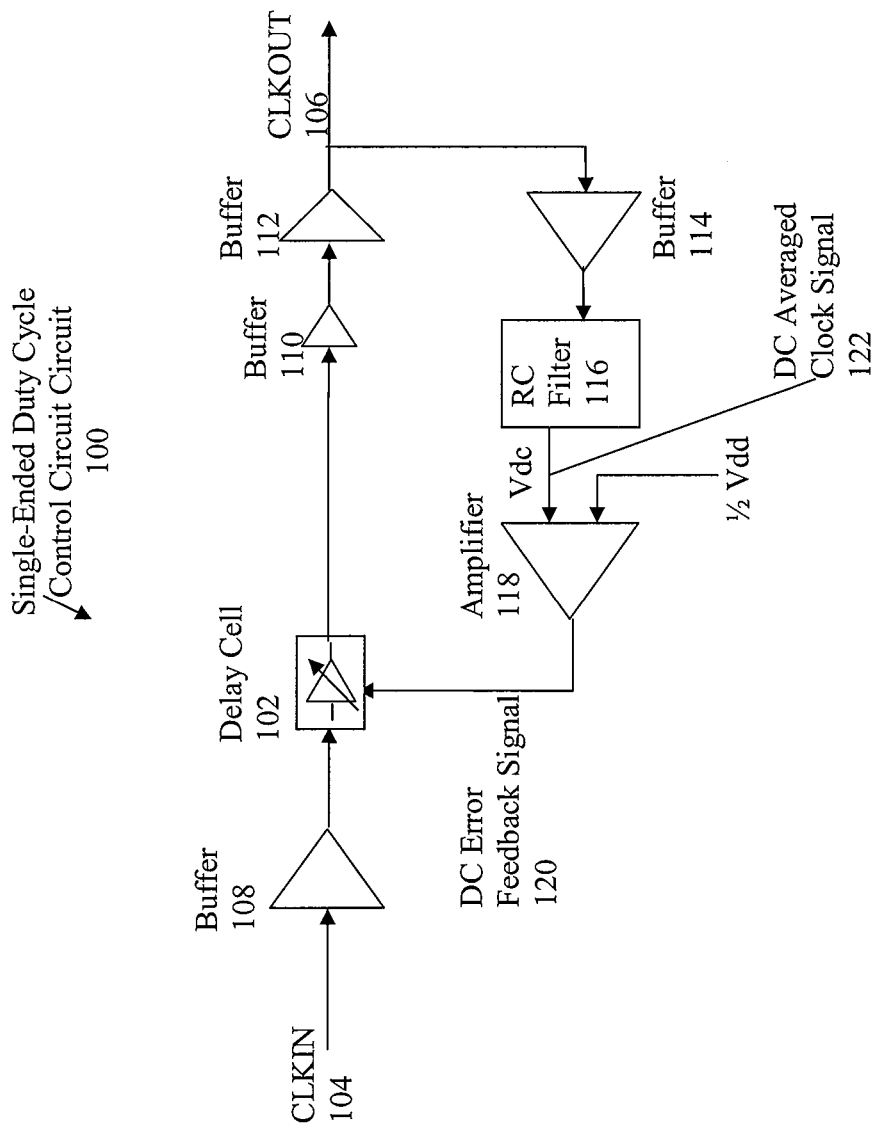
FIG. 1 is a conventional Single-Ended Duty Cycle Correction (SEDCC) circuit that is used to compensate for duty cycle distortion in a clock signal.
Figure 2:
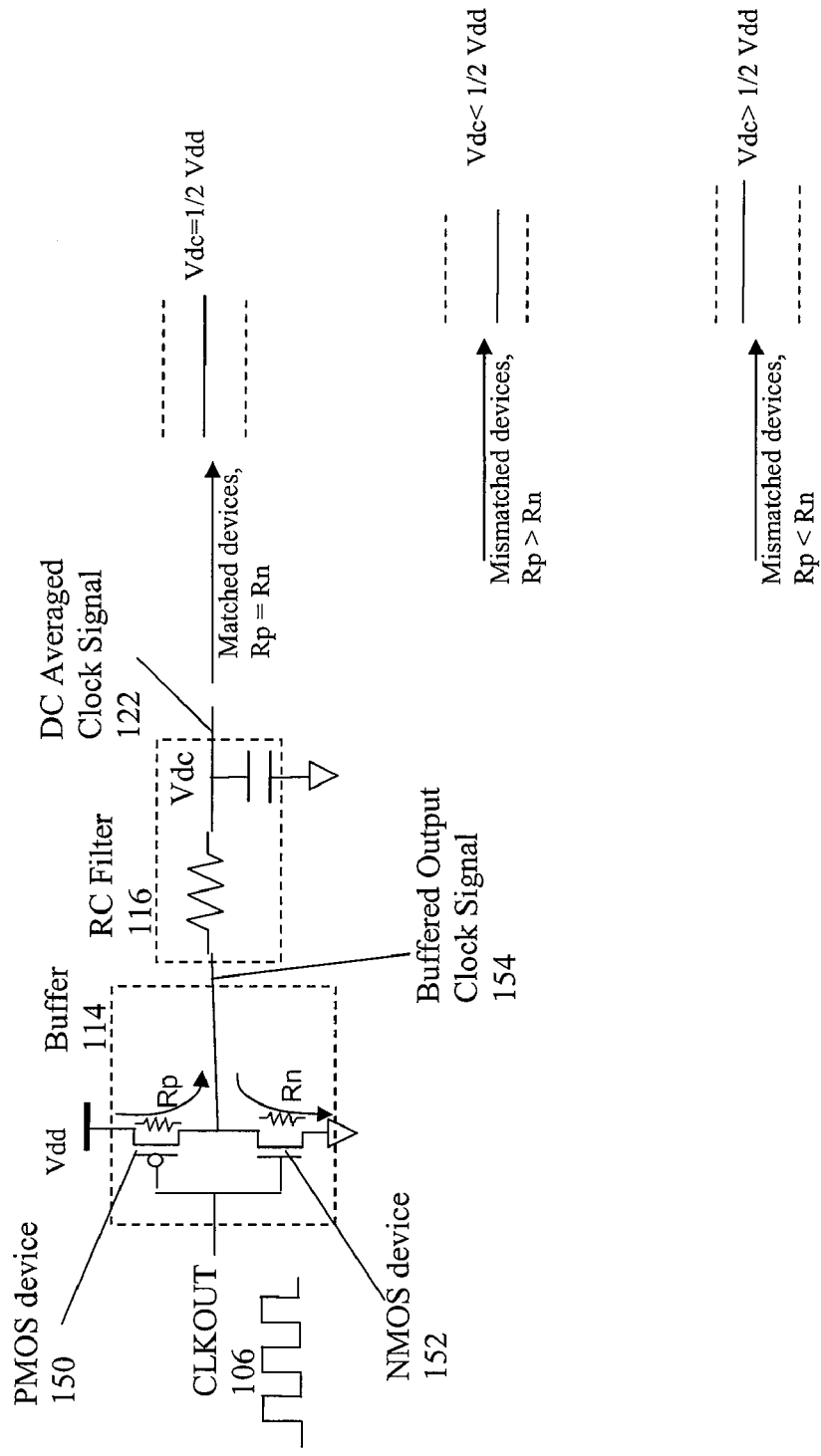
FIG. 2 is a circuit level diagram of a feedback buffer and an RC filter used in a conventional SEDCC circuit.
Figure 3:
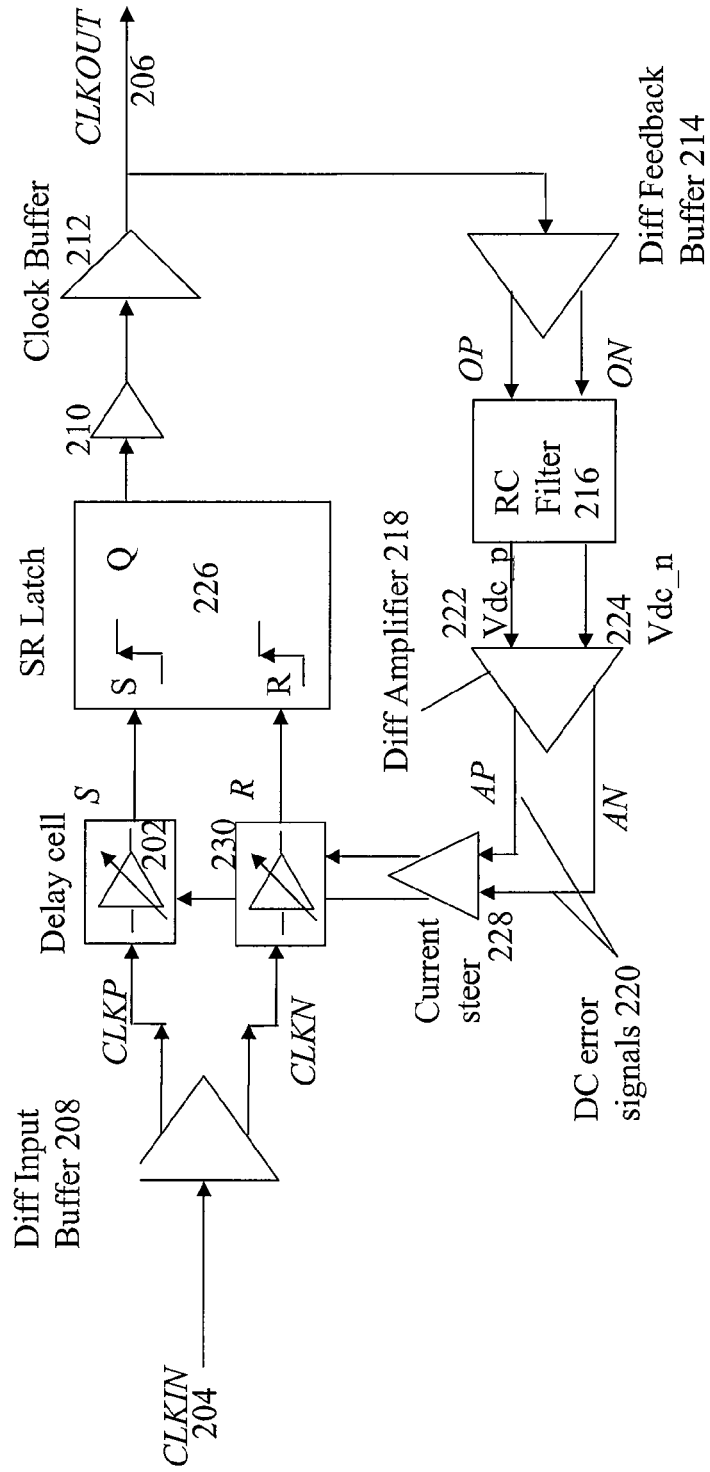
FIG. 3 is a differential duty cycle correction (DDCC) circuit according to one preferred embodiment of the present invention.

FIG. 3 shows a differential duty cycle correction (DDCC) circuit 200 according to one preferred embodiment of the present invention. The DDCC circuit 200 includes a differential input buffer 208 that receives an input clock signal 204. The input clock signal 204 can be a high speed clock signal with a frequency above 200 MHz. The differential buffer 202 converts the input clock signal 204 into two complementary differential input clock signals CLKP and CLKN. The differential input clock signals CLKP and CLKN are input into delay cells 202 and 230, respectively. The delay cells 202 and 230 introduce delays into the differential input clock signals CLKP and CLKN and output delayed differential input clock signals S and R, respectively. The delays introduced by the delay cells 202 and 230 are adjustable and are controlled by currents output from a current steer 228. The DDCC circuit 200 further includes an SR latch 226. The SR latch receives the delayed differential input clock signal S and R and generates an output clock signal 206 through two buffers 210 and 212. The rising edge of the output clock signal 206 is triggered by one of the delayed differential input clock signals S and the falling edge of the output clock signal 206 is triggered by the other of the delayed differential input clock signals R.

The DDCC circuit 200 further includes a feedback loop that includes a differential feedback buffer 214, an RC filter 216 and a differential amplifier 218. The differential feedback buffer 214 converts the output clock signal 206 into two complementary differential output clock signals OP and ON. The RC filter 216 converts the differential output clock signals OP and ON to two DC averaged differential output clock signals 222 and 224, respectively. The DC averaged differential output clock signals 222 and 224 have the same voltage level when the duty cycle of the output clock signal 206 is equal to 50% and have different voltage levels when the duty cycle of the output clock signal 206 is not equal to 50%. The differential amplifier 218 compares the DC averaged differential output clock signals 222 and 224 to each other and generates a pair of DC error signals 220 based on the difference. A voltage differential between the DC error signals 220 causes a current steer 228 to steer more current to one of the delay cells 202, 230 and less current to the other delay cell 202, 230 depending on which of the DC error signals 220 has a higher voltage level. Because the DC error signals 220 are compared to each other and not a fixed reference voltage such as Vdd, no error is introduced by a mismatch between PMOS and NMOS in the differential feedback buffer 214.

The delay cells 202 and 230 adjust the rising edges of the output delayed differential input clock signals S and R based on the current levels output from the current steer 228 in order to bring the DC error signals 220 to approximately the same voltage level. When the DC error signals 220 reach approximately the same voltage level, the DDCC circuit 200 achieves close to a 50% duty cycle in the output clock signal 206.

The waveforms shown in FIG. 4 further illustrate the functionality of the DDCC circuit 200. The input clock signal 204 is shown in FIG. 4(a). The distortion of the input clock signal is calculated by D=50% −(t/T), where D is the distortion in percent, t is the pulse width, and T is the signal period. In a perfect clock signal, the pulse width, t, is exactly 50% of the signal period, T, and D is equal to zero. The input clock signal 204 shown in FIG. 4(a), however, has a pulse width, t, which is less than 50% of the signal period, T. Therefore, the input clock signal 204 shown in FIG. 4(a) has duty cycle distortion.

FIGS. 4(b) and 4(c) show the signals CLKP and CLKN which are output from the differential input buffer 208 of the DDCC circuit 200. The CLKP and CLKN signals are complements of each other and have the same distortion as the input clock signal 204.

FIGS. 4(d) and 4(e) show the signals S and R which are output from the delay cells 202 and 230, respectively, of DDCC circuit 200. The S and R signals are delayed versions of the CLKP and CLKN signals, respectively, and have the same duty cycle distortion as the CLKP and CLKN signals. The delays introduced by the delay cells 202 and 230 are adjustable, are independent of each other, and are controlled by the currents output from the current steer 228.

FIG. 4(f) shows the output clock signal 206 that is generated by the SR latch 226 and is output through buffers 210 and 212. The rising edge of the output clock signal 206 is triggered by the rising edge of the S signal that is output from the upper delay cell 202. The falling edge of the output clock signal is triggered by the rising edge of the R signal that is output from the lower delay cell 230. Therefore, the duty cycle of the output clock signal 206 is controlled by the adjustable delays of the delay cells 202 and 230. The delays of the delay cells 202 and 230 are adjusted to set the duty cycle of the output clock signal 206 close to 50%. However, the output clock signal 206 may still have some residual distortion.

FIGS. 4(g) and 4(h) show the signals OP and ON which are output from the differential feedback buffer 214. The OP and ON signals are complements of each other and have the same residual distortion as the output clock signal 206.

FIGS. 4(i) and 4(j) show the DC error signals 220 signals (AP and AN) that are output from the differential amplifier 218. The AP signal shown in FIG. 4(j) is based on the difference between the duty cycle of the averaged differential output clock signal 222 and 50%. The AN signal shown in FIG. 4(i) is based on the difference between the duty cycle of the other averaged differential output clock signal 224 and 50%. If the duty cycle of the output clock signal 206 is exactly 50%, then the DC error signals 220 signals have equal voltage levels. However, residual distortion in the duty cycle of the output clock signal 206 may cause the DC error signals 220 to have different voltage levels.

Figure 5A:
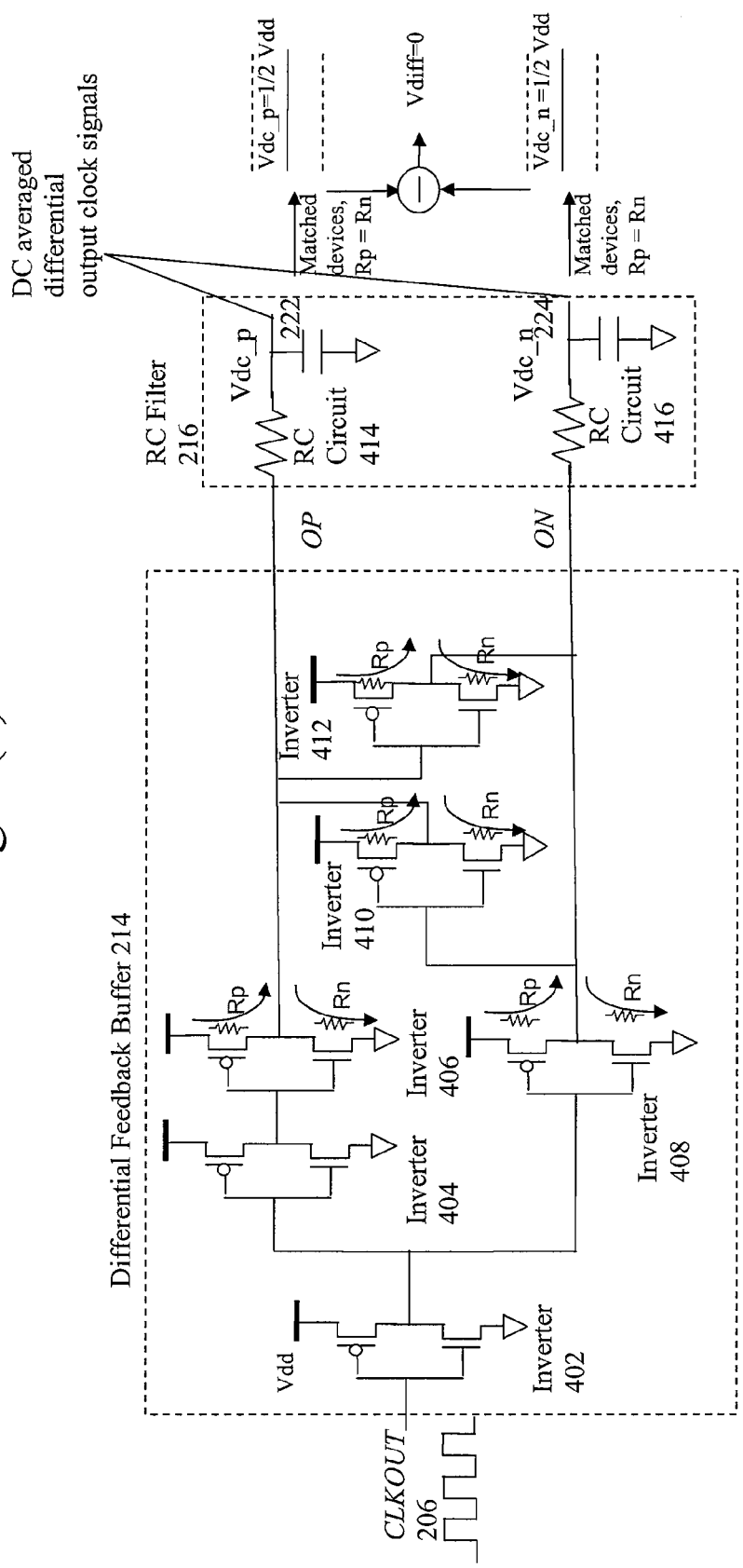
FIG. 5(a) is a circuit level diagram according to one preferred embodiment of a differential feedback buffer and an RC filter of a DDCC circuit.

FIG. 5(a) shows a circuit level diagram according to one preferred embodiment of the differential feedback buffer 214 and the RC filter 216 of the DDCC circuit 200. The differential feedback buffer 214 includes six inverters 402, 404, 406, 408, 410 and 412, each of which includes a cascaded PMOS and NMOS transistor pair connected between Vdd and ground. The differential feedback buffer 214 converts the output clock signal 206 into the two complementary differential output clock signals OP and ON. Each of the differential output clock signals OP and ON has two separate input paths (an upper input path and a lower input path) within the differential feedback buffer 214. The upper input path to the first differential output clock signal OP begins at output of the inverter 402 and passes through inverter 404 and then inverter 406. The lower input path to the first differential output clock signal OP begins at output of the inverter 402 and passes through inverter 408 and then inverter 410. Both of the upper path and lower path to the first differential output clock signal OP include an even number of inverters, resulting in signals that are logically the same. The upper input path to the second differential output clock signal ON begins at output of the inverter 402 and passes through inverter 404, inverter 406 and then inverter 412. The lower input path to the second differential output clock signal ON begins at output of the inverter 402 and passes through inverter 408. Both of the upper path and lower path to the second differential output clock signal ON include an odd number of inverters, resulting in signals that are logically the same. As a result, the differential output clock signals OP and ON are complements of each other.

The RC filter 216 of the DDCC circuit 200 includes a first RC circuit 414 and a second RC circuit 416. The first RC circuit 414 converts the first differential output clock signal OP into a first DC averaged differential output clock signal 222 (Vdc_p). The second RC circuit 416 converts the second differential output clock signal ON into a second DC averaged differential output clock signal 224 (Vdc_n).

The PMOS and NMOS devices of FIG. 5(a) have matched effective resistances Rp and Rn. Therefore, if the duty cycle of the output clock signal 206 is exactly 50%, then the DC averaged differential output clock signals 222 and 224 will have the same voltage level, which is ½ Vdd. However, distortion in the duty cycle of the output clock signal 206 causes the DC averaged differential output clock signals 222 and 224 to have voltage levels that are offset from each other, one greater than ½ Vdd and the other less than ½ Vdd. The voltage offset causes the current steer 228 to adjust the delay cells 202, 230 so that the distortion in the duty cycle of the output voltage 206 is reduced until the DC averaged differential output clock signals 222 and 224 both reach a voltage level of Vdd.

Figure 5B:
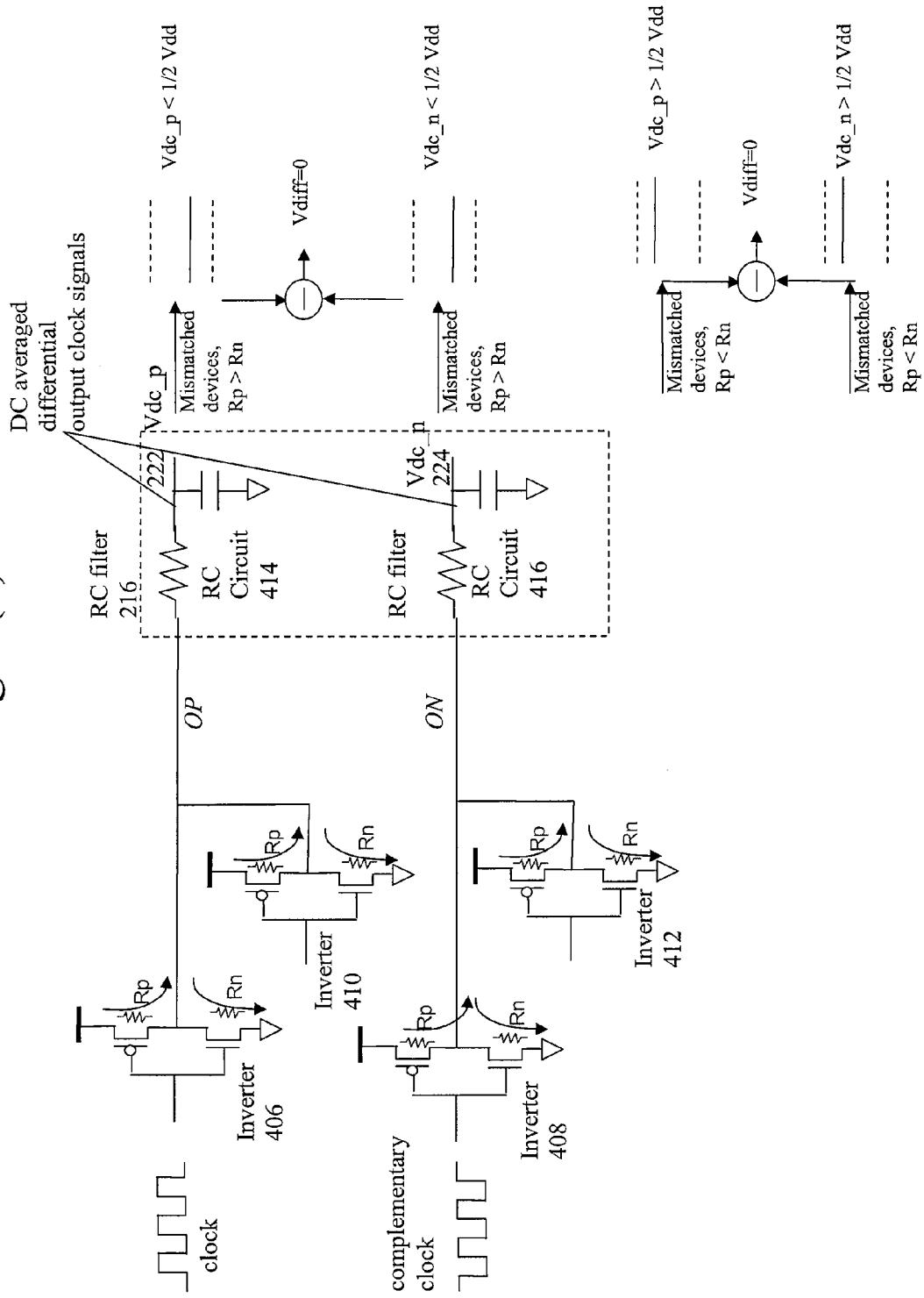
FIG. 5(b) is a circuit level diagram of another preferred embodiment of an RC filter and the output stages of a differential feedback buffer 214 of a DDCC circuit.

FIG. 5(b) shows a circuit level diagram of the RC filter 216 and the output stages of the differential feedback buffer 214 of FIG. 5(a). However, the PMOS and NMOS devices shown in FIG. 5(b) have mismatched effective resistances Rp and Rn. As a result of the mismatched resistances, when the duty cycle of the output clock signal 206 is exactly 50%, both of the DC averaged differential output clock signals 222 and 224 have the same voltage level, but that voltage level is greater than or less than ½. However, when there is distortion in the duty cycle of the output clock signal 206, the DC averaged differential output clock signals 222 and 224 have voltage levels that are offset from each other. The voltage offset causes the current steer 228 to adjust the delay cells 202, 230 so that the distortion in the duty cycle of the output voltage 206 is reduced until the DC averaged differential output clock signals 222 and 224 both reach the same voltage level, which is either greater than or less than ½ Vdd. As such, the mismatch between the PMOS and the NMOS does not affect the accuracy of the DDCC circuit 200.

Figure 6:
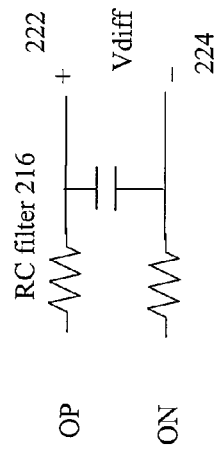
FIG. 6 is a circuit level diagram of a preferred embodiment of an RC filter of a DDCC circuit.

FIG. 6 shows a circuit level diagram in accordance with an alternative embodiment of the RC filter 216 of the DDCC circuit 200 to that shown in FIGS. 5(a) and 5(b).

Figure 7:
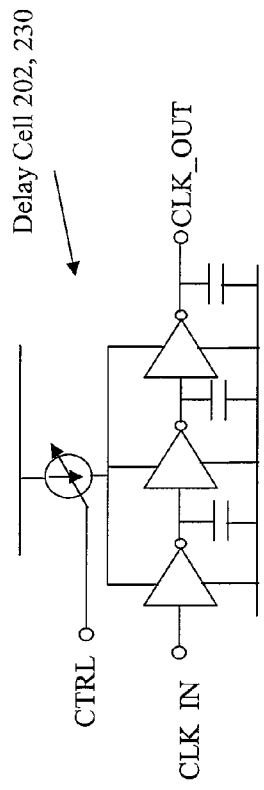
FIG. 7 is a detailed block diagram of one preferred embodiment of a delay cell of a DDCC circuit.

FIG. 7 shows a more detailed block diagram of the delay cells 202, 230 of the DDCC circuit 200 in accordance with one embodiment. The delay cells 202, 230 have multiple stages, each consisting of an inverting buffer having capacitive loading at the output. The delay of the delay cells 202, 230 is adjusted by varying the bias current CTRL.

Figure 8:
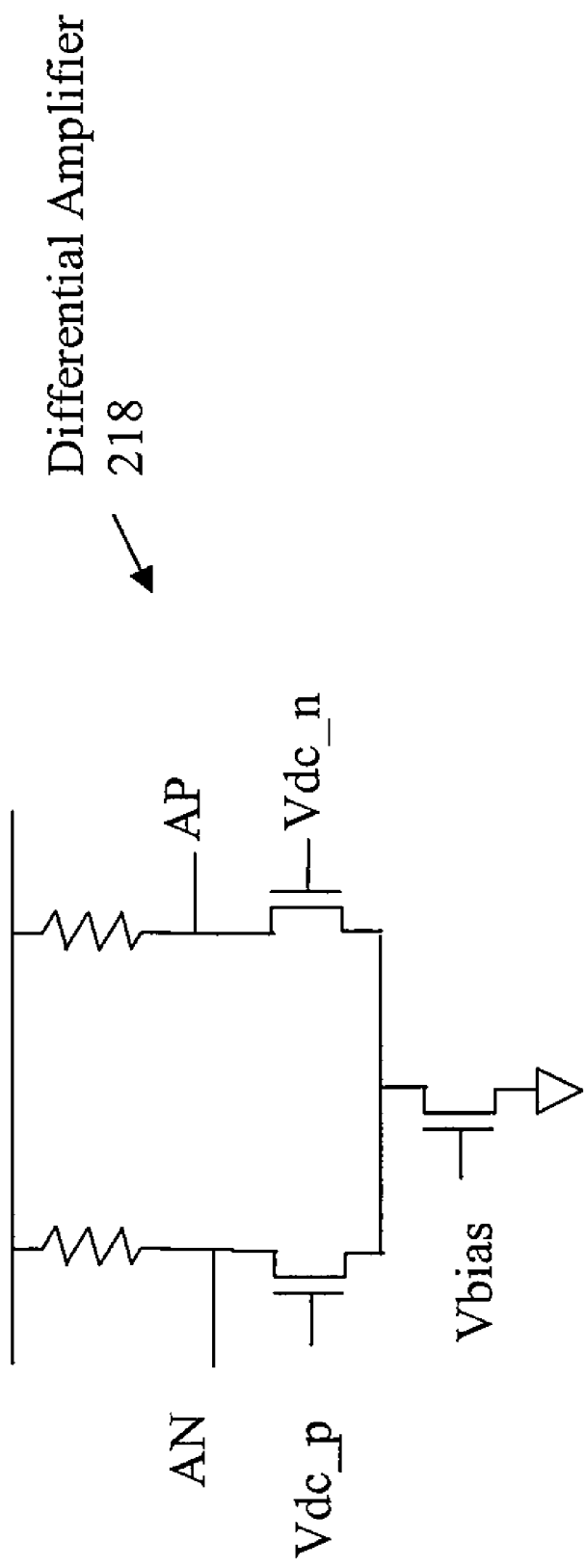
FIG. 8 is a circuit level diagram of a preferred embodiment of a differential amplifier of a DDCC circuit.

FIG. 8 shows a circuit level diagram of a differential amplifier 218 of the DDCC circuit 200 in accordance with one embodiment. The differential amplifier 218 compares the voltage levels of two DC averaged input signals Vdc_p and Vdc_n to each other and generates a pair of DC error signals AP, AN based on the difference in the voltage levels of the input signals Vdc_p and Vdc_n.

The Duty Cycle Distortion Correction Circuit 200 disclosed accurately corrects the duty cycle of a clock signal without any error caused by a mismatch between the NMOS devices and the PMOS devices.

Additional alterations, modifications, and improvements as are made obvious by this disclosure are intended to be part of this description though not expressly stated herein, and are intended to be within the spirit and scope of the invention. Accordingly, the foregoing description is by way of example only, and not limiting. The invention is limited only as defined in the following claims and equivalents thereto.

The invention claimed is:

1. An apparatus for correcting duty cycle distortion in high speed clock signals, the apparatus comprising:

delay cells that delay each of first and second differential initial clock signals;
a latch that generates an output clock signal based on the delayed first and second differential initial clock signals;
a differential feedback buffer that converts the output clock signal into first and second differential feedback signals; and
a feedback circuit that adjusts the delay cells based on the first and second differential feedback signals.

2. The apparatus of claim 1, further comprising:
a first differential buffer that converts an input clock signal into the first and second differential initial clock signals.

3. The apparatus of claim 1, wherein the latch triggers a rising edge of the output clock signal as a function of the rising edge of the first delayed differential initial clock signal and triggers a falling edge of the output clock signal as a function of the rising edge of the second delayed differential initial clock signal.

4. The apparatus of claim 1, wherein the feedback circuit comprises:
a filter that converts the first and second differential feedback signals into first and second direct current (DC) feedback signals, respectively.

5. The apparatus of claim 4, wherein the feedback circuit further comprises:
a differential amplifier that generates a difference signal based on a voltage offset between the first and second DC feedback signals;
wherein the delay cells are adjusted based on the difference signal.

6. The apparatus of claim 4, wherein the feedback circuit further comprises:
a differential amplifier that generates first and second DC error signals based on the first and second DC feedback signals, wherein the delay cells are adjusted based on the first and second DC error signals.

7. The apparatus of claim 6, wherein the feedback circuit further comprises:
a current steer that adjusts the delay cells based on the first and second DC error signals.
wherein the current steer adjusts a first delay cell by controlling the current input to the first delay cell and adjusts a second delay cell by controlling the current input into the second delay cell.

8. The apparatus of claim 6, wherein the feedback circuit further comprises:
a current steer that adjusts the delay cells by controlling currents input to the delay cells.

9. The apparatus of claim 1, wherein the feedback circuit includes:
a current steer that adjusts the delay cells by controlling currents input to the delay cells.

10. A method for correcting duty cycle distortion in high speed clock signals, the method comprising:
delaying each of first and second differential initial clock signals;
generating, using a latch, a single-ended output clock signal based on the delayed first and second differential initial clock signals;
converting the single-ended output clock signal into first and second differential feedback signals; and
adjusting, the delaying, of one or more delay cells, based on the first and second differential feedback signals.

11. The method of claim 10, further comprising:
converting an input clock signal into the first and second differential initial clock signals.

12. The method of claim 10, wherein a rising edge of the single-ended output clock signal is triggered as a function of the rising edge of the first delayed differential initial clock signal and a falling edge of the output clock signal is triggered as a function of the rising edge of the second delayed differential initial clock signal.

13. The method of claim 10, further comprising:
converting the first and second differential feedback signals into first and second direct current (DC) feedback signals, respectively.

14. The method of claim 13, further comprising:
generating a difference signal based on a voltage offset between the first and second DC feedback signals;
wherein the delay cells are adjusted based on the difference signal.

15. The method of claim 13, further comprising:
generating First and second DC error signals based on the first and second DC feedback signals;
wherein the delay cells are adjusted based on the first and second DC error signals.

16. The method of claim 15, further comprising:
adjusting the delay cells based on the first and second DC error signals, wherein a first delay cell is adjusted by controlling the current input to the first delay cell and a second delay is adjusted by controlling the current input into the second delay cell.

17. The method of claim 15, further comprising:
adjusting the delay cells by adjusting currents input to the delay cells.

18. The method of claim 10, further comprising:
adjusting the delay cells by adjusting currents input to the delay cells.

19. An apparatus for correcting duty cycle distortion in high speed clock signals, the apparatus comprising:
a first differential buffer that converts an input clock signal into first and second differential initial clock signals;
a first delay cell that delays the first differential initial clock signals;
a second delay cell that delays the second differential initial clock signals;
a latch that generates an output clock signal based on the delayed first and second differential initial clock signals;
a differential feedback buffer that converts the output clock signal into first and second differential feedback signals;
a filter that converts the first and second differential feedback signals into first and second direct current (DC) feedback signals, respectively; and
a differential amplifier that generates first and second DC error signals based on the first and second DC feedback signals, wherein the first and second delay cells are adjusted based on the first and second DC error signals.

\* \* \* \* \*

UNITED STATES PATENT AND TRADEMARK OFFICE
CERTIFICATE OF CORRECTION

| | | |
|---|---|---|
| PATENT NO. | : 7,733,143 B2 | |
| APPLICATION NO. | : 11/962886 | |
| DATED | : June 8, 2010 | |
| INVENTOR(S) | : Chunbing Guo | |

It is certified that error appears in the above-identified patent and that said Letters Patent is hereby corrected as shown below:

In claim 15, column 7, line 17, "First" should be replaced by -- first --.

Signed and Sealed this
Eleventh Day of December, 2012

David J. Kappos
*Director of the United States Patent and Trademark Office*